United States Patent
Ha et al.

(10) Patent No.: US 8,497,668 B2
(45) Date of Patent: Jul. 30, 2013

(54) POWER CONTROL SYSTEM AND POWER AMPLIFICATION SYSTEM USING THE SAME

(75) Inventors: Sang Hoon Ha, Gyunggi-do (KR); Shinichi Iizuka, Gyunggi-do (KR); Youn Suk Kim, Gyunggi-do (KR); Chul Hwan Yoon, Gyunggi-do (KR); Jun Kyung Na, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 348 days.

(21) Appl. No.: 12/940,155

(22) Filed: Nov. 5, 2010

(65) Prior Publication Data
US 2011/0193545 A1  Aug. 11, 2011

(30) Foreign Application Priority Data
Feb. 8, 2010  (KR) ......................... 10-2010-0011579

(51) Int. Cl.
*G05F 1/40* (2006.01)
(52) U.S. Cl.
USPC .......................................... 323/282; 323/272
(58) Field of Classification Search
USPC ..................... 323/268, 271, 272, 282, 285
See application file for complete search history.

(56) References Cited

U.S. PATENT DOCUMENTS

| 7,005,881 | B2 | 2/2006 | Thiery | |
| 7,710,090 | B1 * | 5/2010 | Kimura | 323/276 |
| 7,724,595 | B2 * | 5/2010 | Lin et al. | 365/207 |
| 2010/0213909 | A1 * | 8/2010 | Nakashimo | 323/282 |
| 2012/0187927 | A1 * | 7/2012 | Yu et al. | 323/271 |

* cited by examiner

*Primary Examiner* — Matthew Nguyen
(74) *Attorney, Agent, or Firm* — Lowe Hauptman Ham & Berner, LLP

(57) ABSTRACT

A power control system includes a power regulator having a plurality of power PMOS transistors connected to a power source in parallel and configured to supply current and voltage controlled according to an input lamp voltage, a current sensing unit connected to the power source and configured to sense currents flowing through a plurality of target PMOS transistors located at predetermined positions among the PMOS transistors, a current mirror unit connected to a first regulated voltage terminal and configured to generate a plurality of currents equal to the sensed currents, a comparator unit configured to total the generated currents to convert the totaled currents into a voltage, and to generate a voltage difference between the voltage and a predetermined reference voltage, and a current bias circuit unit connected to a second regulated voltage terminal and configured to control a bias current according to the generated voltage difference.

16 Claims, 3 Drawing Sheets

POWER CONTROL SYSTEM AND POWER AMPLIFICATION SYSTEM USING THE SAME

CROSS-REFERENCE TO RELATED APPLICATIONS

This application claims the priority of Korean Patent Application No. 10-2010-0011579 filed on Feb. 8, 2010, in the Korean Intellectual Property Office, the disclosure of which is incorporated herein by reference.

BACKGROUND OF THE INVENTION

1. Field of the Invention

The present invention relates to a power control system and a power amplification system using the same, and more particularly, to a power control system that can control a power current on the basis of currents flowing through a plurality of predetermined PMOS transistors among a plurality of power PMOS transistors included in a power regulator, and a power amplification system using the same.

2. Description of the Related Art

With advancements in mobile communications technologies, the demand for power amplifiers, which are used to amplify the output of RF signals in RF terminals of mobile communications terminals, has exploded in recent years. In particular, research has been actively conducted into power amplifiers using CMOS technology for integration and reduction in size, weight, and thickness. In particular, power regulators (LDO: low-dropout) have been developed for power amplifiers so as to stably control the operation of the power amplifiers. Also, research and development efforts focused on providing more stable voltage by using these power regulators (LDO) have been made.

In the related art, a power regulator (LDO) includes a plurality of power PMOS transistors connected in parallel with each other in order to provide currents required by a power amplifier.

The plurality of PMOS transistors respectively supply predetermined amounts of currents. The currents, supplied by the respective PMOS transistors, are totaled to thereby supply the currents required by the power amplifier.

FIG. 1 is a block diagram illustrating a power amplification system according to the related art.

Referring to FIG. 1, a power amplification system using a power regulator according to the related art includes a power regulator 10 and a power amplifier 20 connected to a battery voltage source Vbat in parallel with each other. The power regulator 10 supplies a current Id and a voltage Vd, which are controlled according to a lamp voltage Vramp being input. The power amplifier 20 has a power transistor MOS that receives the voltage and the current from the power regulator 20 to thereby amplify the power of a signal Rfin being input.

Here, a single sensing PMOS transistor that senses a current flowing through a single specific PMOS transistor among a plurality of power PMOS transistors, included in the power regulator 10, is connected in order to accurately control the current being supplied from the power regulator 10.

The current, sensed by the sensing PMOS transistor, is converted into a voltage, and a bias current of the power amplifier is controlled on the basis of a voltage difference between the voltage and a reference voltage.

In the power control system according to the related art, a power regulator includes a plurality of power PMOS transistors. Since the plurality of power PMOS transistors operate at a low source-drain voltage, the power regulator operates even in triode regions where even a small change in a drain current may cause a big change in current. Therefore, under these operating conditions, current control needs to be performed.

In this power control system according to the related art, a current flowing through a single specific PMOS transistor of the power regulator is sensed and converted into a voltage, and a bias current of the power amplifier needs to be controlled according to a voltage difference between the voltage and a reference voltage.

However, the power control system according to the related art, metal lines present between the plurality of power PMOS transistors, included in the power regulator, create different impedances between the plurality of power PMOS transistors due to which, precise control of the electric current may not be achieved.

SUMMARY OF THE INVENTION

An aspect of the present invention provides a power control system that can accurately control a power current as well as a power voltage by controlling the power current on the basis of a current flowing through a plurality of predetermined PMOS transistors among a plurality of power PMOS transistors, and a power amplification system using the same.

According to an aspect of the present invention, there is provided a power control system including: a power regulator having a plurality of power PMOS transistors connected to a power source in parallel with each other and supplying currents and voltage being controlled according to a lamp voltage being input; a current sensing unit connected to the power source and sensing currents flowing through a plurality of target PMOS transistors located at predetermined positions among the plurality of power PMOS transistors; a current mirror unit connected to a first regulated voltage terminal and generating a plurality of currents equal to the currents sensed by the current sensing unit; a comparator unit totaling the plurality of currents generated by the current mirror unit to convert the totaled currents into a voltage, and generating a voltage difference between the voltage and a predetermined reference voltage; and a current bias circuit unit connected to a second regulated voltage terminal and controlling a bias current according to the voltage difference from the comparator unit.

The current sensing unit may include: a plurality of sensing PMOS transistors having sources connected to the voltage source in parallel with each other and gates respectively connected to gates of the plurality of target PMOS transistors located at the predetermined positions among the plurality of power PMOS transistors; first to m-th operational amplifiers each having first and second input terminals respectively connected to two drains of each of first to m-th PMOS transistor pairs consisting of target and sensing PMOS transistors connected in parallel with each other among the plurality of target PMOS transistors and the plurality of sensing PMOS transistors; and a plurality of sensing transistors cascode-connected between drains of the plurality of sensing PMOS transistors and a ground and gates respectively connected to output terminals of the first to m-th operational amplifiers.

The first to m-th operational amplifiers may each control voltages across the two drains of each of the plurality of PMOS transistor pairs consisting of the target and sensing PMOS transistors connected in parallel with each other among the plurality of target PMOS transistors and the plurality of sensing PMOS transistors.

The current mirror unit may include: a plurality of current mirroring NMOS transistors having gates connected to the respective gates of the plurality of sensing NMOS transistors and sources connected to a ground; a plurality of first current mirroring PMOS transistors having drains and gates connected to respective drains of the plurality of current mirroring NMOS transistors and sources connected to the first regulated voltage terminal; and a plurality of second current mirroring PMOS transistors respectively connected to the plurality of first current mirroring PMOS transistors to thereby form current mirror circuits.

The comparator unit may total currents flowing through the second current mirroring PMOS transistors of the current mirror unit.

The lamp voltage may be determined as a voltage corresponding to a predetermined power.

First and second regulate voltages may each be controlled to a positive voltage by using the power source.

The comparator unit may include: a current-to-voltage converter totaling the plurality of currents generated by the current mirror unit to convert the totaled currents into a voltage; a predistorter controlling a magnitude of the voltage obtained by the current-to-voltage converter.

According to another aspect of the present invention, there is provided a power amplification system including: a power regulator having a plurality of power PMOS transistors connected to a power source in parallel with each other and supplying currents and voltage being controlled according to a lamp voltage being input; a current sensing unit connected to the power source and sensing currents flowing through a plurality of target PMOS transistors located at predetermined positions among the plurality of power PMOS transistors; a current mirror unit connected to a first regulated voltage terminal and generating a plurality of currents equal to the currents sensed by the current sensing unit; a comparator unit totaling the plurality of currents generated by the current mirror unit, converting the totaled currents into a voltage, and generating a difference voltage between the voltage and a predetermined reference voltage; a current bias circuit unit connected to a second regulated voltage terminal and controlling a bias current according to a magnitude of a bias current being controlled by the current bias circuit.

The current sensing unit may include: a plurality of sensing PMOS transistors having sources connected to the voltage source in parallel with each other and gates respectively connected to gates of the target PMOS transistors located at the predetermined positions among the plurality of power PMOS transistors; first to m-th operational amplifiers each having first and second input terminals respectively connected to two drains of each of first to m-th PMOS transistor pairs consisting of the target and sensing PMOS transistors connected in parallel with each other among the plurality of target PMOS transistors and the plurality of sensing PMOS transistors; and a plurality of sensing transistors cascode-connected between drains of the plurality of sensing PMOS transistors and a ground and gates respectively connected to output terminals of the first to m-th operational amplifiers.

The plurality of first to m-th operational amplifiers may each control voltages across the two drains of each of the plurality of PMOS transistor pairs consisting of the target and sensing PMOS transistors connected in parallel with each other among the plurality of target PMOS transistors and the plurality of sensing PMOS transistors.

The current mirror unit may include: a plurality of current mirroring NMOS transistors having gates connected to the respective gates of the plurality of sensing NMOS transistors and sources connected to a ground; a plurality of first current mirroring PMOS transistors having drains and gates connected to the drains of the plurality of current mirroring NMOS transistors and sources connected to the first regulated voltage terminal; and a plurality of second current mirroring PMOS transistors connected to the plurality of first current mirroring PMOS transistors to form current mirror circuits.

The comparator unit may total currents flowing through the plurality of second current mirroring PMOS transistors of the current mirror unit.

The comparator unit may total currents flowing through the plurality of second current mirroring PMOS transistors of the current mirror unit.

First and second regulated voltages may each be controlled to a positive voltage by using the power source so that each of the first and second regulated voltages becomes more stable than the power source.

The power amplifier system of claim 9, wherein the comparator unit may include: a current-to-voltage converter totaling the plurality of currents generated by the current mirror unit to convert the totaled currents into a voltage; a predistoter controlling a magnitude of the voltage obtained by the current-to-voltage converter; and a comparator generating a voltage difference between the voltage from the predistorter and a predetermined reference voltage.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
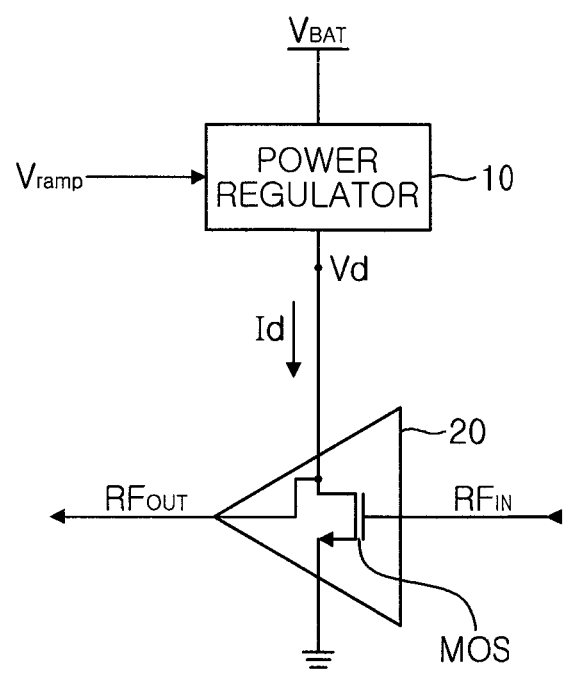
FIG. 1 is a block diagram illustrating the configuration of a power amplification system according to the related art.

Exemplary embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

Figure 2:
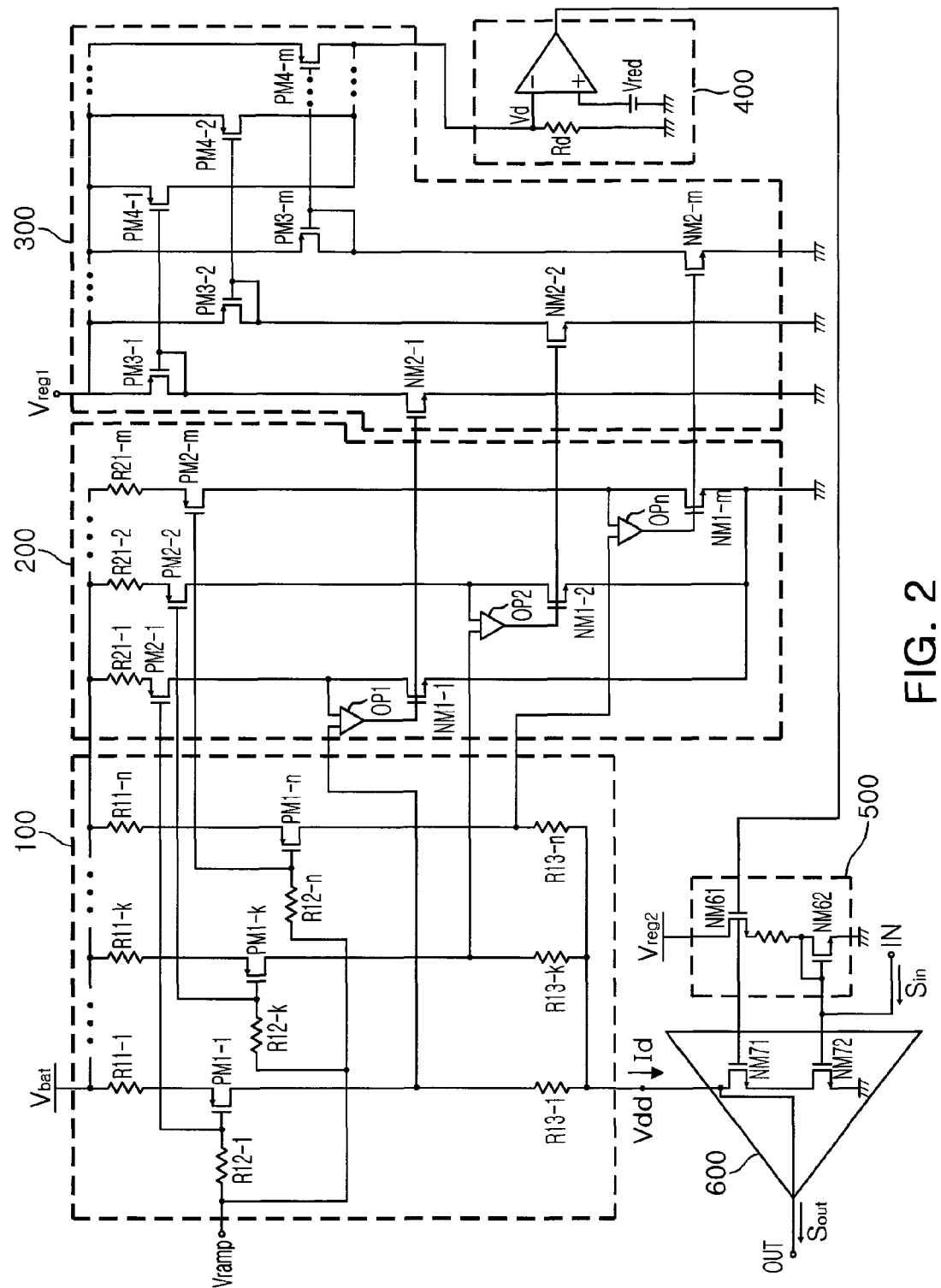
FIG. 2 is a block diagram illustrating the configuration of a power amplification system according to an exemplary embodiment of the present invention.

FIG. 2 is a block diagram illustrating the configuration of a power amplification system according to an exemplary embodiment of the present invention.

Referring to FIG. 2, a power amplification system according to this embodiment may include a power regulator 100, a current sensing unit 200, a current mirror unit 300, a comparator unit 400, and a current bias circuit unit 500. The power regulator 100 includes a plurality of power PMOS transistors PM1-1 to PM1-$n$ connected to a voltage source Vbat, such as a battery, in parallel with each other and supplies a current Id and a voltage Vd being controlled according to a lamp voltage Vramp being input. The current sensing unit 200 is connected to the voltage source Vbat and senses respective currents flowing through a plurality of target PMOS transistors PM1-$k$, PM1-$k+i$, ..., PM1-$k+p$ located at predetermined positions among the plurality of power PMOS transistors PM1-1 to PM1-$n$. The current mirror unit 300 is connected to a first regulated voltage Vreg1 terminal and generates currents the same as the respective currents sensed by the current sensing unit 200. The comparator unit 400 totals the currents generated by the current mirror unit 300 to convert the totaled currents into a voltage, and generates a voltage difference between the voltage and a predetermined reference voltage. The current bias circuit unit 500 is connected to a second regulated voltage Vreg2 terminal and controls a bias current according to the voltage difference generated by the comparator unit 400.

Here, in the power regulator 100, resistors R11-1 to R11-$n$, connected to sources of the power PMOS transistors PM1-1 to PM1-$n$, resistors R12-1 through R12-$n$, connected to gates of the plurality of power PMOS transistors PM1-1 to PM1-$n$, and resistors R13-1 to R13-$n$ of the plurality of power PMOS transistors PM1-1 to PM1-$n$ are bias resistors.

Furthermore, the above-described power amplification system may include a power amplifier 600 having a power gain being controlled according to the magnitude of the bias current being controlled by the current bias circuit unit 500.

Here, the power amplifier 600 may include first and second power NMOS transistors NM71 and NM72 connected in a cascode configuration.

The current sensing unit 200 may include a plurality of sensing PMOS transistors PM2-1 to PM2-$m$ that have sources connected to the voltage source Vbat in parallel with each other and gates connected to gates of the plurality of target PMOS transistors PM1-$k$, PM1-$k+i$, ..., PM1-$k+p$ located at the predetermined positions among the plurality of power PMOS transistors PM1-1 to PM1-$n$.

Here, resistors R21-1 to R21-$m$, connected to the sources of the plurality of sensing PMOS transistors PM2-1 to PM2-$m$ of the current sensing unit 200, are bias resistors.

Here, the current sensing unit 200 may include at least two sensing PMOS transistors PM2-1 to PM2-$n$. For example, the current sensing unit 200 may include two sensing PMOS transistors PM2-1 and PM2-2 or three sensing PMOS transistors PM2-1, PM2-2, and PM2-3.

Furthermore, the current sensing unit 200 may include a plurality of first to m-th operational amplifiers OP1 to OPm each having first and second input terminals respectively connected to two drains of each of a plurality of first to m-th PMOS transistor pairs consisting of target and sensing PMOS transistors connected in parallel with each other among the plurality of target PMOS transistors PM1-$k$, PM1-$k+i$, ..., PM1-$k+p$ and the plurality of sensing PMOS transistors PM2-1 to PM2-$m$.

The current sensing unit 200 may include a plurality of sensing NMOS transistors NM1-1 through NM1-$m$ connected in a cascode configuration between the drains of the plurality of sensing PMOS transistors PM2-1 to PM2-$m$ and a ground, and having gates connected to output terminals of the plurality of first to m-th operational amplifiers OP1 to OPm.

Figure 3:
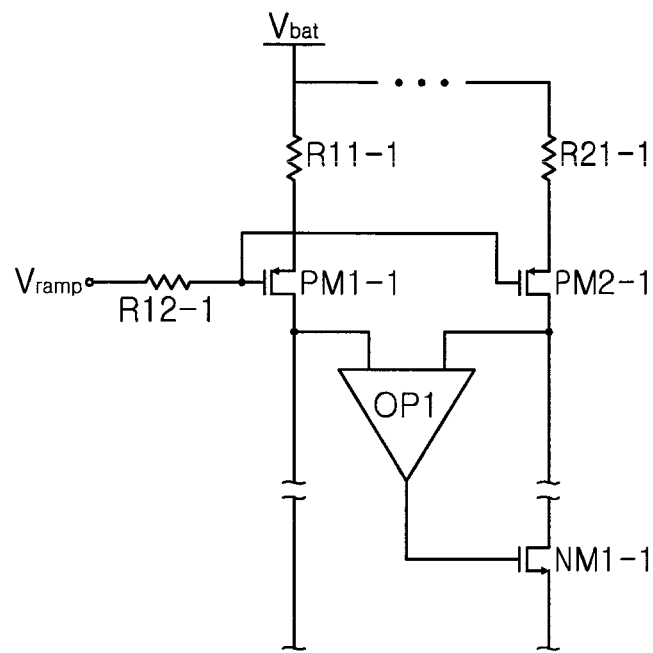
FIG. 3 is a partial circuit diagram illustrating a current sensing unit according to an exemplary embodiment of the present invention.

FIG. 3 is a partial circuit diagram illustrating a current sensing unit according to an exemplary embodiment of the invention.

Referring to FIGS. 1 and 3, the plurality of first to m-th operational amplifiers OP1 to OPm may equally control voltages across the two drains of each of the plurality of PMOS transistor pairs consisting of the target and sensing PMOS transistors connected in parallel with each other among the plurality of target PMOS transistors PM1-$k$, PM1-$k+i$, ..., PM1-$k+$ and the plurality of the plurality of sensing PMOS transistors PM2-1 to PM2-$m$.

The current mirror unit 300 includes a plurality of current mirroring NMOS transistors NM1-1 through NM1-$m$ having gates connected to the respective gates of the plurality of sensing NMOS transistors NM1-1 through NM1-$m$ and sources connected to the ground.

Furthermore, the current mirror unit 300 includes a plurality of first current mirroring PMOS transistors PM3-1 through PM3-$m$ having drains and gates connected to respective drains of the plurality of current mirroring NMOS transistors NM1-1 through NM1-$m$ and sources connected to the first regulated voltage Vreg1 terminal.

The current mirror unit 300 includes a plurality of second current mirroring PMOS transistors PM4-1 through PM4-$m$ connected to the first current mirroring PMOS transistors PM3-1 through PM3-$m$, respectively, to thereby form a current mirror circuit.

Here, the comparator unit 400 is configured to total currents flowing through the plurality of second current mirroring PMOS transistors PM4-1 through PM4-$m$ of the current mirror unit 300.

For example, with reference to FIG. 2, the power amplifier 600 amplifies the power of an input signal Sin through an input terminal IN and outputs the input signal having the amplified power through an output terminal OUT. In order to amplify the power of the input signal, the power amplifier 600 may include the first and second power NMOS transistors NM71 and NM72 connected in a cascode configuration.

Specifically, the first power NMOS transistor NM71 may include a drain simultaneously connected to a drain voltage Vdd terminal of the power regulator 100 and the output terminal OUT, a source connected to the drain of the second power NMOS transistor NM72, and a gain connected to the current bias circuit unit 500.

Furthermore, the second power NMOS transistor NM72 may include a drain connected to the source of the first power NMOS transistor NM71, a source connected to the ground, and a gain simultaneously connected to the current bias circuit unit 500 and the input terminal IN.

Referring to FIG. 1, the current bias circuit unit 500 may include a first NMOS transistor NM61 and a second NMOS transistor NM62. The first NMOS transistor NM61 is connected to the second regulated voltage Vreg2 terminal and is connected in parallel with the first power NMOS transistor NM71. The second NMOS transistor NM62 is cascode-connected to the first NMOS transistor NM61 and is connected in parallel with the second power NMOS transistor NM72 to form a current mirror.

The lamp voltage Vramp may be set to a voltage corresponding to a predetermined power. For example, when a power control system according to an exemplary embodiment of the invention is applied, the lamp voltage Vramp may be set to a voltage corresponding to transmission power.

Furthermore, each of the first and second regulated voltages Vreg1 and Vreg2 is controlled to a positive voltage by using the voltage source Vbat and may be more stable than the voltage source Vbat.

Figure 4:
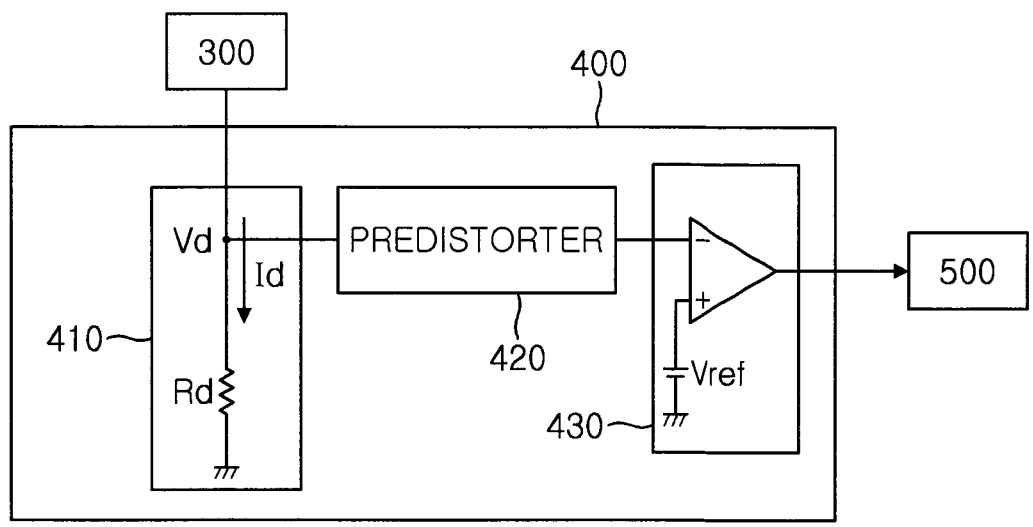
FIG. 4 is a view illustrating the configuration of a comparator unit according to an exemplary embodiment of the present invention.

FIG. 4 is a view illustrating the configuration of a comparator unit according to an exemplary embodiment of the invention.

Referring to FIG. 4, the comparator unit 400 may include a current-to-voltage converter 410, a predistorter 420, and a comparator 430. The current-to-voltage converter 410 totals the plurality of currents generated by the current mirror unit 300 and converts the totaled currents into a voltage Vd. The predistorter 420 adjusts the magnitude of the voltage Vd obtained by the conversion of the current-to-voltage converter 410. The comparator 430 generates a voltage difference between the voltage from the predistorter 420 and a predetermined reference voltage Vref.

Hereinafter, the operation and effects of the invention will be described with reference to the accompanying drawings.

The operation of the power amplification system according to an exemplary embodiment of the invention will be described with reference to FIGS. 2 through 4. In FIG. 2, predetermined levels of currents flow through the plurality of power PMOS transistors PM1-1 to PM1-$n$ included in the power regulator 100 of the power amplification system according to the lamp voltage Vramp.

Here, the lamp voltage Vramp may be determined as a voltage corresponding to the predetermined power.

Then, the current sensing unit 200 detects the currents flowing through the respective target PMOS transistors PM1-$k$, PM1-$k+i$, ..., PM1-$k+p$ located at predetermined positions among the plurality of power PMOS transistors PM1-1 to PM1-$n$.

Specifically, currents identical to the currents flowing through the target PMOS transistors PM1-$k$, PM1-$k+i$, ..., PM1-$k+p$ located at predetermined positions among the plurality of power PMOS transistors PM1-1 to PM1-$n$, flow through the plurality of sensing PMOS transistors PM2-1 to PM2-$m$ of the current sensing unit 200.

As described above, the current sensing unit 200 may include at least two sensing PMOS transistors.

For example, when the power regulator 100 includes ten PMOS transistors PM1-1 to PM1-10 and the current sensing unit 200 includes two sensing PMOS transistors PM1-1 and PM1-2, currents flowing through two target PMOS transistors PM1-1 and PM1-10 may be sensed.

In another example, when the current sensing unit 200 includes three sensing PMOS transistors PM1-1 to PM1-3, currents flowing through three target PMOS transistors PM1-1, PM1-5, and PM1-10 may be sensed.

Referring to FIGS. 2 and 3, the first to m-th operational amplifiers OP1 to OPm of the current sensing unit 200 each have first and second input terminals respectively connected to two drains connected to each of the plurality of first to PMOS transistor pairs connected in parallel with each other among the plurality of target PMOS transistors PM1-$k$, PM1-$k+i$, ..., PM1-$k+p$ and the plurality of sensing PMOS transistors PM2-1 to PM2-$m$.

That is, the first operational amplifier OP1 includes first and second input terminals connected to drains of the power PMOS transistor PM1-1 and the sensing PMOS transistor PM2-1 connected in parallel with each other to thereby form the first PMOS transistor pair. The first operational amplifier OP1 operates such that the first and second input terminals have the same electrical potential. Therefore, by the first operational amplifier OP1, two drain voltages of the first PMOS transistor consisting of the first power PMOS transistor PM1-1 and the first sensing PMOS transistor PM2-1 equalize levels.

In the same manner, the m-th operational amplifier OPm includes first and second input terminals connected to drains of the power PMOS transistor PM1-$n$ and the sensing PMOS transistor PM2-$m$ connected in parallel with each other to thereby form the m-th PMOS transistor pair. The m-th operational amplifier OPm operates such that the first and second input terminals have the same electrical potential. Therefore, by the m-th operational amplifier OPm, two drain voltages of the m-th PMOS transistor pair consisting of the power PMOS transistor PM1-$n$ and the sensing PMOS transistor PM2-$m$ equalize voltages.

The plurality of sensing NMOS transistors NM1-1 through NM1-$m$ of the current sensing unit 200 control drain-source currents according to signals being output from the first to m-th operational amplifiers OP1 to OPm.

Then, the current mirror unit 300 according to this embodiment is connected to the first regulated voltage Vreg1 terminal and generates a plurality of currents having equal to the currents sensed by the current sensing unit 200.

Here, the first regulated voltage Vreg1 is controlled to a positive voltage by using the voltage source Vbat so that the first regulated voltage Vreg1 may be more stable than the voltage source Vbat.

Then, the comparator unit 400 according to this embodiment totals the plurality of currents generated by the current mirror unit 300 and converts the totaled currents into a voltage, thereby generating a voltage difference between the voltage and a predetermined reference voltage.

Then, the current bias circuit unit 500 is connected to the second regulated voltage Vreg2 terminal and controls the bias current according to the voltage difference from the comparator unit 400.

Here, the second regulated voltage Vreg2 is controlled to a positive voltage by using the voltage source Vbat, so that the second regulated voltage Vreg2 may be more stable than the voltage source Vbat.

The power amplifier 600 according to this embodiment has a power gain being controlled according to the magnitude of the bias current being controlled by the current bias circuit unit 500.

The current mirror unit 300 will be described with reference to FIGS. 2 and 3.

In FIG. 2, currents equal to the respective currents flowing through the plurality of sensing NMOS transistors NM1-1 through NM1-$m$ flow through the plurality of current mirroring NMOS transistors NM1-1 through NM1-$m$ of the current mirror unit 300.

The first current mirroring PMOS transistors PM3-1 through PM3-$m$ of the current mirror unit 300 are individually connected to the first regulated voltage Vreg1 terminal and are individually connected to the plurality of current mirroring NMOS transistors NM1-1 through NM1-$m$ to thereby form a stack structure, so that currents equal to the currents flowing through the plurality of current mirroring NMOS transistors NM1-1 through NM1-$m$ flow through the first current mirroring PMOS transistors PM3-1 through PM3-$m$.

The second current mirroring PMOS transistors PM4-1 through PM4-$m$ of the current mirror unit 300 form individual current mirror circuits along with the first current mirroring PMOS transistors PM3-1 through PM3-$m$, so that currents equal to the currents flowing through the first current mirroring PMOS transistors PM3-1 through PM3-$m$ flow through the second current mirroring PMOS transistors PM4-1 through PM4-$m$.

Here, the comparator unit 400 totals the respective currents flowing through the second current mirroring PMOS transistors PM4-1 through PM4-$m$ of the current mirror unit 300.

Referring to FIG. 4, the current-to-voltage converter 410 of the comparator unit 400 totals the plurality of currents generated by the current mirror unit 300, converts the sum into a voltage, and transmits the voltage to the predistorter 420.

The predistorter 420 adjusts the magnitude of the voltage converted by the current-to-voltage converter 410 to transmit the voltage having the adjusted magnitude to the comparator 430.

The comparator 430 generates a voltage difference between the voltage from the predistorter 420 and the predetermined reference voltage and outputs the voltage difference to the current bias circuit unit 500.

Referring to FIG. 2, the first NMOS transistor NM61 of the current bias circuit unit 500 allows a current to flow through the second NMOS transistor NM62 according to the voltage difference from the comparator unit 400.

Therefore, in the power amplifier 600, a current equal to the current flowing through second NMOS transistor NM62 also flows through the second power NMOS transistor NM72 forming a current mirror along with the second NMOS transistor NM62, and the same amount of current also flows through the first power NMOS transistor NM71.

According to the above-described operation, the current bias circuit unit 500 may accurately control the bias current of the power amplifier according to the voltage difference of the comparator unit 400.

As described above, currents flowing through power PMOS transistors located at predetermined various positions are sensed in consideration of parasitic resistance components caused by differences in positions of the power PMOS transistors, thereby stably inducing the operation of a current control loop.

Furthermore, a multi-sensor is used and currents, sensed by the multi-sensor, are compared with each other to thereby reduce detection deviation and perform accurate current detection.

As set forth above, according to exemplary embodiments of the invention, a power current is controlled on the basis of currents flowing through a plurality of predetermined PMOS transistors among a plurality of power PMOS transistors included in a power regulator, so that the power current as well as a power voltage can be more accurately controlled.

While the present invention has been shown and described in connection with the exemplary embodiments, it will be apparent to those skilled in the art that modifications and variations can be made without departing from the spirit and scope of the invention as defined by the appended claims.

What is claimed is:

1. A power control system comprising:
   a power regulator having a plurality of power P-type metal oxide semiconductor (PMOS) transistors connected to a power source in parallel with each other and supplying currents and voltage being controlled according to a lamp voltage being input;
   a current sensing unit connected to the power source and sensing currents flowing through a plurality of target PMOS transistors located at predetermined positions among the plurality of power PMOS transistors;
   a current mirror unit connected to a first regulated voltage terminal and generating a plurality of currents equal to the currents sensed by the current sensing unit;
   a comparator unit totaling the plurality of currents generated by the current mirror unit to convert the totaled currents into a voltage, and generating a voltage difference between the voltage and a predetermined reference voltage; and
   a current bias circuit unit connected to a second regulated voltage terminal and controlling a bias current according to the voltage difference from the comparator unit.

2. The power control system of claim 1, wherein the current sensing unit comprises:
   a plurality of sensing PMOS transistors having sources connected to the voltage source in parallel with each other and gates respectively connected to gates of the plurality of target PMOS transistors located at the predetermined positions among the plurality of power PMOS transistors;
   first to m-th operational amplifiers, where m is a positive integer, each having first and second input terminals respectively connected to two drains of each of first to m-th PMOS transistor pairs consisting of target and sensing PMOS transistors connected in parallel with each other among the plurality of target PMOS transistors and the plurality of sensing PMOS transistors; and
   a plurality of sensing N-type metal oxide semiconductor (NMOS) transistors cascode-connected between drains of the plurality of sensing PMOS transistors and a ground, and gates respectively connected to output terminals of the first to m-th operational amplifiers.

3. The power control system of claim 2, wherein each of the first to m-th operational amplifiers equally control voltages across the two drains of each of the plurality of PMOS transistor pairs consisting of the target and sensing PMOS transistors connected in parallel with each other among the plurality of target PMOS transistors and the plurality of sensing PMOS transistors.

4. The power control system of claim 2, wherein the current mirror unit comprises:
   a plurality of current mirroring NMOS transistors having gates connected to the respective gates of the plurality of sensing NMOS transistors and sources connected to a ground;
   a plurality of first current mirroring PMOS transistors having drains and gates connected to respective drains of the plurality of current mirroring NMOS transistors and sources connected to the first regulated voltage terminal; and
   a plurality of second current mirroring PMOS transistors respectively connected to the plurality of first current mirroring PMOS transistors to thereby form a current mirror circuit.

5. The power control system of claim 4, wherein the comparator unit totals currents flowing through the second current mirroring PMOS transistors of the current mirror unit.

6. The power control system of claim 1, wherein the lamp voltage is determined as a voltage corresponding to a predetermined power.

7. The power control system of claim 1, wherein first and second regulated voltages each are controlled to a positive voltage by using the power source.

8. The power control system of claim 1, wherein the comparator unit comprises:
   a current-to-voltage converter totaling the plurality of currents generated by the current mirror unit to convert the totaled currents into a voltage;
   a predistorter adjusting a magnitude of the voltage from the current-to-voltage converter; and
   a comparator generating a voltage difference between the voltage from the predistorter and a predetermined reference voltage.

9. A power amplification system comprising:
   a power regulator having a plurality of power P-type metal oxide semiconductor (PMOS) transistors connected to a power source in parallel with each other and supplying currents and voltage being controlled according to a lamp voltage being input;
   a current sensing unit connected to the power source and sensing currents flowing through a plurality of target PMOS transistors located at predetermined positions among the plurality of power PMOS transistors;

a current mirror unit connected to a first regulated voltage terminal and generating a plurality of currents equal to the currents sensed by the current sensing unit;

a comparator unit totaling the plurality of currents generated by the current mirror unit, converting the totaled currents into a voltage, and generating a difference voltage between the voltage and a predetermined reference voltage;

a current bias circuit unit connected to a second regulated voltage terminal and controlling a bias current according to the difference voltage from the comparator unit; and a power amplifier having a power gain being controlled according to a magnitude of the bias current being controlled by the current bias circuit.

10. The power amplification system of claim 9, wherein the current sensing unit comprises:

a plurality of sensing PMOS transistors having sources connected to the voltage source in parallel with each other and gates respectively connected to gates of the target PMOS transistors located at the predetermined positions among the plurality of power PMOS transistors;

first to m-th operational amplifiers, where m is a positive integer, each having first and second input terminals respectively connected to two drains of each of first to m-th PMOS transistor pairs consisting of the target and sensing PMOS transistors connected in parallel with each other among the plurality of target PMOS transistors and the plurality of sensing PMOS transistors; and a plurality of sensing N-type metal oxide semiconductor (NMOS) transistors cascode-connected between drains of the plurality of sensing PMOS transistors and a ground, and gates respectively connected to output terminals of the first to m-th operational amplifiers.

11. The power amplification system of claim 10, wherein each of the plurality of first to m-th operational amplifiers equally control voltages across the two drains of each of the plurality of PMOS transistor pairs consisting of the target and sensing PMOS transistors connected in parallel with each other among the plurality of target PMOS transistors and the plurality of sensing PMOS transistors.

12. The power amplification system of claim 10, wherein the current mirror unit comprises:

a plurality of current mirroring NMOS transistors having gates connected to the respective gates of the plurality of sensing NMOS transistors and sources connected to a ground;

a plurality of first current mirroring PMOS transistors having drains and gates connected to drains of the plurality of current mirroring NMOS transistors and sources connected to the first regulated voltage terminal; and a plurality of second current mirroring PMOS transistors respectively connected to the plurality of first current mirroring PMOS transistors to form a current mirror circuit.

13. The power amplification system of claim 12, wherein the comparator unit totals currents flowing through the plurality of second current mirroring PMOS transistors of the current mirror unit.

14. The power amplification system of claim 9, wherein the lamp voltage is determined as a voltage corresponding to a predetermined transmission power.

15. The power amplification system of claim 9, wherein first and second regulated voltages each are controlled to a positive voltage by using the power source so that each of the first and second regulated voltages becomes more stable than the power source.

16. The power amplification system of claim 9, wherein the comparator unit comprises:

a current-to-voltage converter totaling the plurality of currents generated by the current minor unit to convert the totaled currents into a voltage;

a predistoter adjusting a magnitude of the voltage from the current-to-voltage converter; and a comparator generating a voltage difference between the voltage from the predistorter and a predetermined reference voltage.

* * * * *